(12) United States Patent
Lee et al.

(10) Patent No.: US 10,048,137 B2
(45) Date of Patent: Aug. 14, 2018

(54) SEMICONDUCTOR DEVICES INCLUDING ELECTRODES FOR TEMPERATURE MEASUREMENT

(71) Applicant: Samsung Electronics Co., Ltd., Suwon-Si, Gyeonggi-Do (KR)

(72) Inventors: Kyongtaek Lee, Suwon-si (KR); Sangwoo Pae, Seongnam-si (KR); Junekyun Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 876 days.

(21) Appl. No.: 14/506,956

(22) Filed: Oct. 6, 2014

(65) Prior Publication Data

US 2015/0098489 A1    Apr. 9, 2015

(30) Foreign Application Priority Data

Oct. 7, 2013    (KR) ........................ 10-2013-0119446

(51) Int. Cl.
| | |
|---|---|
| *G01K 7/00* | (2006.01) |
| *G01K 7/01* | (2006.01) |
| *H01L 29/78* | (2006.01) |
| *B82Y 40/00* | (2011.01) |
| *H01L 29/775* | (2006.01) |
| *H01L 29/06* | (2006.01) |
| *H01L 27/088* | (2006.01) |
| *H01L 23/34* | (2006.01) |

(52) U.S. Cl.
CPC ................ *G01K 7/01* (2013.01); *B82Y 40/00* (2013.01); *H01L 27/0886* (2013.01); *H01L 29/0673* (2013.01); *H01L 29/775* (2013.01); *H01L 29/785* (2013.01); *H01L 23/34* (2013.01); *H01L 2924/0002* (2013.01)

(58) Field of Classification Search
USPC .................................. 374/178, 100; 257/467
See application file for complete search history.

(56) References Cited

U.S. PATENT DOCUMENTS

| | | | | |
|---|---|---|---|---|
| 4,158,807 A | * | 6/1979 | Senturia | ............ H01L 29/42312 257/253 |
| 5,463,233 A | * | 10/1995 | Norling | ................ H01H 1/0036 257/254 |
| 5,466,484 A | * | 11/1995 | Spraggins | ........... H01L 27/0802 257/529 |

(Continued)

FOREIGN PATENT DOCUMENTS

| | | |
|---|---|---|
| JP | 1995-235577 A | 9/1995 |
| JP | 1999-153490 A | 6/1999 |

(Continued)

*Primary Examiner* — Mirellys Jagan
(74) *Attorney, Agent, or Firm* — Harness, Dickey & Pierce, P.L.C.

(57) ABSTRACT

A semiconductor device includes: a semiconductor substrate; a plurality of conductive lines formed on the semiconductor substrate; and an electrode for temperature measurement. The electrode is connected to the plurality of conductive lines. An electronic device includes a semiconductor device and has a temperature sensing function. The semiconductor device includes: a semiconductor substrate; a plurality of conductive lines formed on the semiconductor substrate; and an electrode for temperature measurement.

17 Claims, 17 Drawing Sheets

(56) References Cited

U.S. PATENT DOCUMENTS

| | | | | |
|---|---|---|---|---|
| 5,683,569 A | * | 11/1997 | Chung | G01N 27/4143 |
| | | | | 204/416 |
| 6,151,771 A | * | 11/2000 | Tzeng | G01K 7/183 |
| | | | | 29/610.1 |
| 7,357,035 B2 | | 4/2008 | Liu et al. | |
| 7,655,944 B1 | * | 2/2010 | Darwish | G06F 17/5018 |
| | | | | 257/415 |
| 7,862,233 B2 | * | 1/2011 | Hyde | G01N 27/18 |
| | | | | 257/467 |
| 8,047,713 B2 | * | 11/2011 | Ueno | G01J 5/02 |
| | | | | 374/163 |
| 2003/0122168 A1 | * | 7/2003 | Masleid | H01L 23/367 |
| | | | | 257/288 |
| 2014/0103902 A1 | * | 4/2014 | Otremba | H01L 23/49524 |
| | | | | 324/76.11 |
| 2014/0283616 A1 | * | 9/2014 | Jayaraman | G01L 9/0042 |
| | | | | 73/754 |

FOREIGN PATENT DOCUMENTS

| | | |
|---|---|---|
| JP | 3266074 B2 | 3/2002 |
| JP | 4739360 B2 | 8/2011 |
| KR | 10-2000-0032278 A | 6/2000 |

\* cited by examiner

SEMICONDUCTOR DEVICES INCLUDING ELECTRODES FOR TEMPERATURE MEASUREMENT

CROSS-REFERENCE TO RELATED APPLICATIONS

This application claims priority under 35 U.S.C. § 119 to Korean Patent Application No. 10-2013-0119446, filed on Oct. 7, 2013, in the Korean Intellectual Property Office, the disclosure of which is incorporated herein in its entirety by reference.

BACKGROUND

Field

Example embodiments of inventive concepts relate to semiconductor devices, and more particularly, to semiconductor devices that may more precisely measure temperature of semiconductor devices, and/or electronic devices including the same.

Description of Related Art

As semiconductor devices become more highly integrated, heat generated when a semiconductor device is driven is not dissipated outside of the semiconductor device. As a result, the temperature of the semiconductor device increases (self heating effect), and the performance of an original circuit design cannot be guaranteed. For example, although a three-dimensional (3D) structure, such as Fin-FET, is a semiconductor device that may increase a driving current by two times or more compared to an existing two-dimensional structure, a degree of heat dissipation is lowered due to a narrow bulk region. As a result, the 3D structure is more affected by increases in temperature.

Although an apparatus having an additional temperature sensor is installed within the semiconductor device, the apparatus is relatively far from a position in which temperature should be measured, and thus, the temperature measurements are relatively imprecise. Thus, temperature needs to be measured at a place in which a distance between the device and an object to be measured is small enough to measure the temperature of the device.

SUMMARY

At least some example embodiments of inventive concepts provide semiconductor devices that measure temperature at positions in which distances between the device and portions to be actually driven is sufficiently small.

At least some example embodiments of inventive concepts also provide electronic devices having a corresponding output according to temperature measured using the semiconductor device.

At least some example embodiments may improve performance of circuits and/or more accurately predict reliability of semiconductor devices in preparation for temperature increases of the semiconductor devices.

According to at least some example embodiments, conductive lines that are elements of semiconductor devices are an object for temperature measurement. When the conductive lines are used, temperature may be measured at a position close or substantially close (e.g., very close) to the semiconductor device relative to a case in which an additional temperature sensor is used, or a case in which wiring that is relatively distant from an actually-driven portion is used (as in the related art). Accordingly, a more exact temperature of the element may be measured, and the performance of a circuit may be more accurately predicted.

Accordingly, at least some example embodiments of inventive concept provide semiconductor devices that measure more exact temperature relative to the related art by connecting an electrode for temperature measurement directly to conductive lines formed on a semiconductor substrate.

According to at least one example embodiment of inventive concepts, a semiconductor device includes: a semiconductor substrate; a plurality of conductive lines formed on the semiconductor substrate; and an electrode for temperature measurement connected to the plurality of conductive lines.

The semiconductor device may further include an active region formed in the semiconductor substrate. The active region may include: a source and a drain region; and a channel region between the source and the drain region. The conductive lines may be gate lines that pass a top surface of the channel region.

The active region may be fin-shaped, and the fin-shaped active region may have the source and the drain region therein and the channel region therebetween. The gate lines may pass the top surface and sidewalls of the channel region. The fin-shaped active region may include a plurality of fin-shaped structures that are shared at sides of the active region.

The active region may extend in a first direction, and the gate lines may extend in a second direction, which is different from a first direction.

According to at least some example embodiments, the gate lines may include: at least one gate line; at least one wordline; at least one bitline; at least one dummy gate line; at least one dummy wordline; and/or at least one dummy bitline.

The dummy gate lines may be dummy gate lines that are closest to an element of which temperature is to be measured.

The electrode for temperature measurement connected to the conductive lines may be a multipoint probe (e.g., a 2-point or 4-point probe).

The semiconductor device may be configured to output a temperature according to resistance measured by the multipoint (e.g., 4-point) probe using temperature coefficient of resistance (TCR).

At least one other example embodiment provides an electronic device including: a semiconductor device; and a circuit configured to receive temperature measured using an electrode for temperature measurement, and to output a signal corresponding to the measured temperature. The semiconductor device includes: a semiconductor substrate; a plurality of conductive lines formed on the semiconductor substrate; and the electrode for temperature measurement connected to the plurality of conductive lines.

According to at least some example embodiments, the circuit that operates according to the measured temperature may be a current/voltage controller.

The circuit that operates according to the measured temperature may evaluate a current flow of wiring.

At least one other example embodiment provides an electronic device including: at least one multipoint probe connected to at least one of a plurality of conductive lines of a semiconductor device, the at least one multipoint probe being configured to measure resistance of the at least one of the plurality of conductive lines, the measured resistance being indicative of temperature changes in the semiconductor device; and a temperature calculation circuit configured to calculate a temperature based on the resistance measured by the at least one multipoint probe according to a temperature coefficient of resistance (TCR).

The at least one multipoint probe may include at least one of a 4-point and a 2-point probe configured to measure a resistance variation rate of the at least one of the plurality of conductive lines. The at least one of the plurality of conductive lines includes at least one of a gate line, a wordline, a bitline, a dummy gate line, a dummy wordline and a dummy bitline.

According to at least some example embodiments, the electronic device may further include: a controller configured to control at least one of voltage and current according to the measured temperature.

According to at least some example embodiments, the electronic device may further include: a temperature output circuit configured to output at least one of the calculated temperature, a voltage and a current according to the calculated temperature.

The multipoint probe may be connected directly to the at least one of the plurality of conductive lines.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
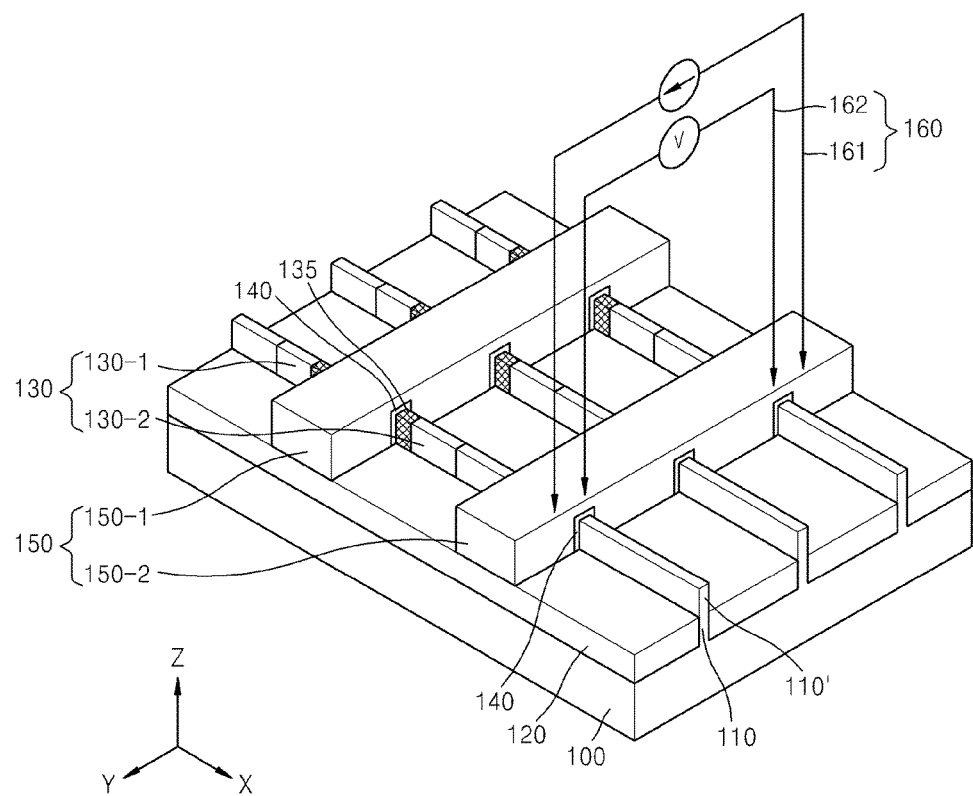
FIGS. 1 through 9 are perspective views illustrating semiconductor devices according to example embodiments of inventive concepts.

Example embodiments will now be described more fully with reference to the accompanying drawings. Inventive concepts may, however, be embodied in many different forms and should not be construed as being limited to the exemplary embodiments set forth herein; rather, these embodiments are provided so that this disclosure will be thorough and complete, and will fully convey the concept of the invention to those skilled in the art.

In the drawings, like reference numerals refer to like elements, and redundant descriptions thereof will be omitted. Furthermore, various elements and regions in the drawings are schematically drawn. Thus, the inventive concept is not limited by a relative size or distance drawn in the attached drawings.

It will be understood that, although the terms first and second etc. may be used herein to describe various elements, components, regions, layers and/or sections, these elements, components, regions, layers and/or sections should not be limited by these terms. These terms are only used to distinguish one element, component, region, layer or section from another element, component, region, layer or section. For example, a first element could be termed a second element, and similarly, a second element could be termed a first element without departing from the teachings of the example embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, for example, illustrated shapes may be deformed according to fabrication technology and/or tolerances. Therefore, the example embodiments of inventive concepts are not limited to certain shapes illustrated in the present specification, and may include modifications of shapes caused in fabrication processes.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

A semiconductor devices according to an example embodiment of inventive concepts includes: a semiconductor substrate; conductive lines formed in the semiconductor substrate; and an electrode for temperature measurement connected to the conductive lines. The following drawings are perspective views illustrating major elements of semiconductor devices according to example embodiments of inventive concepts. In the drawings, only major elements of the semiconductor devices are illustrated, and thus, it will be understood that some elements are omitted.

A conductive region of the semiconductor device is generally formed in a two-dimensional, flat semiconductor substrate. However, a three-dimensional (3D) structure may be formed in the semiconductor substrate so that the conductive region may be formed in the 3D structure. This is because a surface area affected by an electric field caused by a gate electrode may be increased to increase an active region and to flow a relatively high current. However, when the relatively high current flows, heat dissipation caused thereby is relatively large. The conductive region having the 3D structure has a relatively narrow bulk region in which heat may be dissipated, despite an increase in heat dissipation. Thus, heat generated by driving a semiconductor device causes the device itself to have increasing temperature (self heating effect). Since circuit driving is relatively easily affected by the increasing temperature of the semiconductor device, temperature measurement of the device may be relatively important. Thus, when the conductive region of the semiconductor device has the 3D structure, performing more precise temperature measurement by connecting the configuration of the device itself and an electrode for temperature measurement may be required.

FIG. 1 is a perspective view of a semiconductor device according to an example embodiment of inventive concepts.

Referring to FIG. 1, a semiconductor substrate 100 may be formed of one among semiconductor materials used to form substrates, such as a silicon substrate, a germanium substrate, a silicon-germanium substrate, a silicon-carbide substrate, a gallium-arsenide substrate, an indium-arsenide substrate, an indium-phosphide substrate, etc. Also, these materials may be monocrystalline, polycrystalline, or amorphous materials.

The semiconductor substrate 100 includes a 3D structure in the form of a line that protrudes perpendicular to the semiconductor substrate 100 (z-direction) and extends in one direction (x-direction). (Hereinafter, the 3D structure is referred to as a semiconductor pin 110.) The 3D structure may be formed by performing a pattern forming process and an etching process. The semiconductor pin 110 may be a plurality of semiconductor pins. The plurality of semiconductor pins may be formed in parallel to each other along one direction (x-direction). The 3D structure formed in the semiconductor substrate 100 is not limited to the above-described pin shape and may be a structure having various cross-sections, such as a spherical shape, a diamond shape, and the like.

A first insulating layer 120, such as an oxide layer, is filled in a portion of the semiconductor substrate 100 in which no semiconductor pins 110 are formed. In this case, each of the semiconductor pins 110 are formed to a given (or alternatively, a desired or predetermined) height of the entire height of the semiconductor pins 110 so that parts of both sidewalls of the semiconductor pin 110 and an upper portion of the semiconductor pin 110 may be exposed. The exposed parts of both sidewalls and upper portion of the semiconductor pin 110 are portions in which channel regions 135 will be formed. The first insulating layer 120 may be formed of a material used to form an insulating layer, such as a silicon oxide layer, a silicon nitride layer, a combination thereof, or the like.

The semiconductor pin 110 may include a conductive region 130 doped with a p-type or n-type impurity. Conductive lines 150 may be arranged in a direction (y-direction) that is perpendicular to an extension direction of the semiconductor pin 110. The conductive lines 150 may extend in the y-direction while surrounding a top surface and sidewalls of the semiconductor pin 110. The conductive lines 150 may extend in the y-direction across the plurality of semiconductor pins 110 that are disposed in parallel to each other. The conductive lines 150 may include at least one material selected from the group consisting of metal, a semiconductor doped with an impurity, a conductive metal nitride, a conductive metal oxide, metal silicide, and the like. In more detail, at least one material may be polysilicon, doped polysilicon, titanium nitride (TiN), titanium carbonitride (TiCN), and chromium nitride (CrN), which are examples of the conductive metal nitride, cobalt silicide ($CoSi_x$), nickel silicide ($NiSi_x$), and manganese silicide ($MnSi_x$), which are examples of the metal silicide layer, or a mixture thereof. A source region 130-1/a drain region 130-2 may be formed in the semiconductor pin 110 at both sides of gate lines 150-1 that will be described below.

The conductive lines 150 may be gate lines, for example. A second insulating layer 140 may be formed between the conductive lines 150 and the semiconductor pin 110. That is, for example, the gate lines 150-1 may be formed to cover the first insulating layer 120 that is formed flat and sidewalls and an upper portion of the second insulating layer 140 formed on the exposed surface of the semiconductor pin 110 and to extend in one direction (y-direction). When a voltage is applied to the gate lines 150-1, portions of conductive regions 130 that are spaced apart from each other due to the second insulating layer 140 constitute the channel region 135. A plurality of gate lines 150-1 may be formed at intervals. The plurality of gate lines 150-1 may extend in parallel to each other on the semiconductor substrate 110 along one direction (y-direction).

Figure 2:
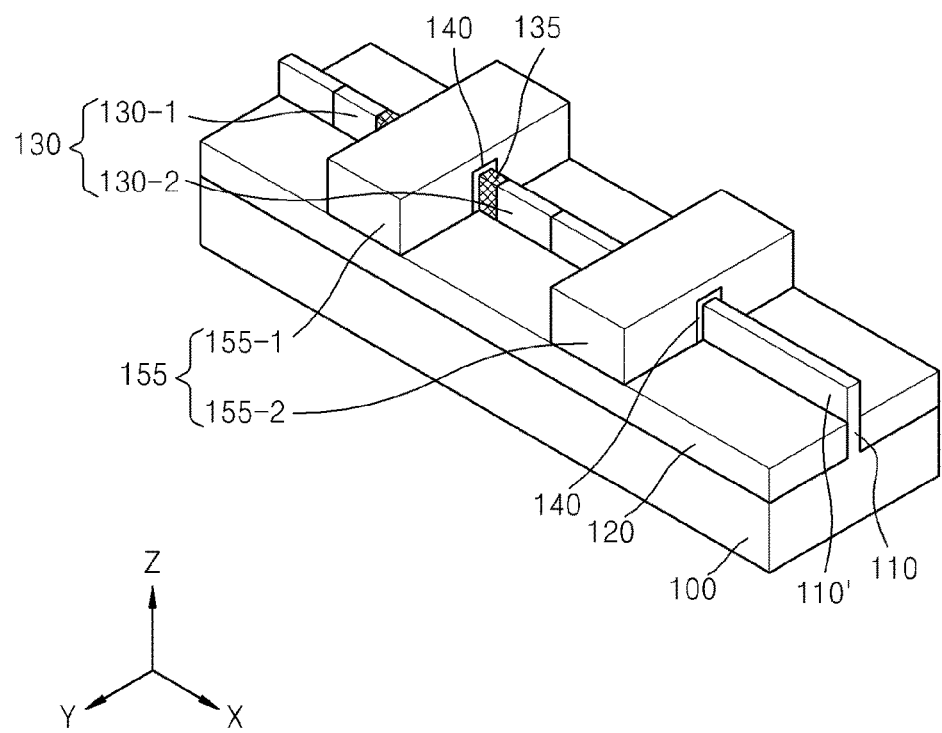

FIG. 2 is a perspective view illustrating a semiconductor device according to another example embodiment of inventive concepts.

Referring to FIG. 2, a plurality of gate lines 155 that share one semiconductor pin 110 are shown. The plurality of gate lines 155 that extend in the y-direction may share the semiconductor pin 110 that extends in the x-direction. When a first gate line 155-1 extends across the semiconductor pin 110, a second gate line 155-2 that is spaced apart from the first gate line 155-1 by a gap may extend across the semiconductor pin 110 while being spaced apart from a position in which the first gate line 155-1 passes the semiconductor pin 110.

Referring back to FIG. 1, the plurality of conductive lines 150 that extend in the y-direction may share the plurality of semiconductor pins 110 that extend in the x-direction.

The extension direction of the conductive lines 150 and the extension direction of the channel region 135 may not be perpendicular to each other. The conductive lines 150 may extend in a second direction that is different from a first direction as the extension direction of the channel region 135.

The plurality of conductive lines 150 may include at least one of gate lines 150-1 that are essential for a circuit operation and at least one of dummy gate lines 150-2 that have substantially no relation with the circuit operation. In this case, the gate lines 150-1 and the dummy gate lines 150-2 may be spaced apart from each other by a gap and may extend across the semiconductor pin 110. In an associated example embodiment, the dummy gate lines 150-2 may be alternately formed at intervals with the gate lines 150-1 and may share the semiconductor pin 110.

If any voltage is applied to the gate lines 150-1, the channel region 135 is formed between the source region 130-1 and the drain region 130-2. When a circuit is driven, an active region is formed in the semiconductor pin 110. Thus, heat generated in the channel region 135 and in the vicinity of the channel region 135 is transferred to the dummy gate lines 150-2 through the shared semiconductor pin 110. Since the dummy gate lines 150-2 that share the semiconductor pin 110 are very close to the channel region 135 to be measured, dispersion of temperature is relatively small, and a temperature similar or substantially similar to a temperature in the vicinity of the channel region 135 is established. Since the dummy gate lines 150-2 relatively precisely measure the temperature of the vicinity of the channel region 135, and do not directly affect the circuit operation, temperature may be measured while driving the circuit.

Since the gate lines 150-1 are conductive lines that are most adjacent to the channel region 135, but have a configuration in which a voltage is applied to the gate lines 150-1, the gate lines 150-1 may not be an object for easily measuring temperature caused by a change in resistance when the circuit is driven, and when the dummy gate lines 150-2 that do not share the semiconductor pin 110 is used, the dummy gate lines 150-2 are close to the channel region 135, but may not expect the same active diffusion.

For temperature measurement, a multi-point (e.g., 2-point or 4-point) probe may be connected to the gate lines that pass the channel region of which temperature is to be measured, and/or to the dummy gate lines that share the semiconductor pin.

In the example embodiment shown in FIG. 1, a 4-point probe 160 is connected to the dummy gate lines 150-2 that share the semiconductor pin 110 with the gate lines 150-1. In this example, two needles 161 of the 4-point probe 160 through which a current flows, are connected to an outer side of the dummy gate lines 150-2, whereas two needles 162 that measure voltage are connected to an inner side of the dummy gate lines 150-2, thereby measuring resistance. In this example, the two needles 162 for measuring voltage are connected to the dummy gate lines 150-2 inside the two needles 161 for measuring current.

According to one or more example embodiments, when there are plurality of gate lines to be measured and a plurality of dummy gate lines that share the semiconductor pin, the 4-point probe may be connected to the dummy gate lines that are closest to the gate lines to be measured. This is to measure temperature at a position most adjacent to the channel region and at which a difference in temperature is smallest.

According to example embodiments discussed herein, resistance measured from the 4-point probe 160 connected to the conductive lines 150 may be converted into temperature using a temperature coefficient of resistance (TCR). A TCR represents a resistance variation rate with respect to a unit temperature. A case in which temperature increases and a resistance value thereof increases is referred to as a positive TCR, and a case in which temperature increases and the resistance value thereof decreases is referred to as a negative TCR. In this example embodiment, the fact that temperature may be measured using only a varying resistance value if a resistance variation rate with respect to the temperature of a material is known, is used. The material used to form the gate lines 150-1 may be metal, a conductive non-metal material, such as polysilicon, or a combined material thereof. TCRs regarding these materials are already known or may be measured relatively easily through experiments.

Figure 3:
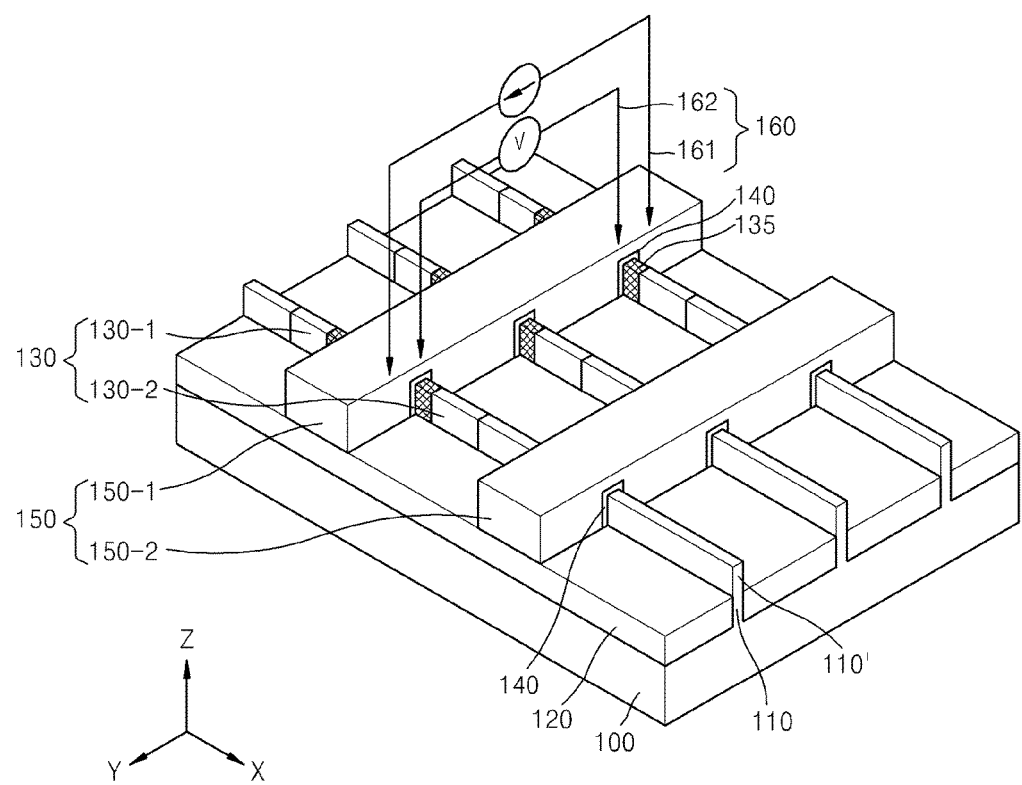

FIG. 3 illustrates a semiconductor device according to another example embodiment of inventive concepts.

Referring to FIG. 3, not dummy gate lines 150-2, but gate lines 150-1 are objects to be measured. Since the gate lines 150-1 to which a voltage is applied drive the circuit, temperature measurement via the gate lines 150-1 may be limited to being performed only when the device is not driven. However, since the gate lines 150-1 are conductive lines that are closest to a channel region 135, temperature of the gate lines 150-1 may be measured during a time interval at which the device is not driven.

In more detail, the semiconductor device including the gate lines 150-1 to which an electrode for temperature measurement is connected, may be provided. The 4-point probe 160 is connected to the gate lines 150-1 that pass the channel region 135 of which temperature is to be measured or the vicinity of the channel region 135. Two needles 161 of the 4-point probe 160 through which current flows, are connected to an outer side of the gate lines 150-1, whereas two needles 162 that measure voltage are connected to an inner side of the gate lines 150-1, thereby measuring resistance. In this example, the two needles 162 for measuring voltage are connected to the gate lines 150-1 inside the two needles 161 for measuring current.

Other example embodiments of semiconductor devices in which an electrode for temperature measurement is connected to the gate lines 150-1, will be described below. A semiconductor device in which the 4-point probe 160 is connected to a single gate line 150-1 that does not share the semiconductor pin 110 with other gate lines 150-1, may be provided. Alternatively, a semiconductor device in which the semiconductor pin 110 is not shared with the dummy gate lines 150-2, but only between a plurality of gate lines 150-1 and the 4-point probe 160 is connected to one gate line 150-1, may be provided. Alternatively, a semiconductor device in which the 4-point probe 160 is connected to the gate lines 150-1 that share the semiconductor pin 110 with the dummy gate lines 150-2 may be provided. FIG. 2 illustrates the last case.

Figure 4:
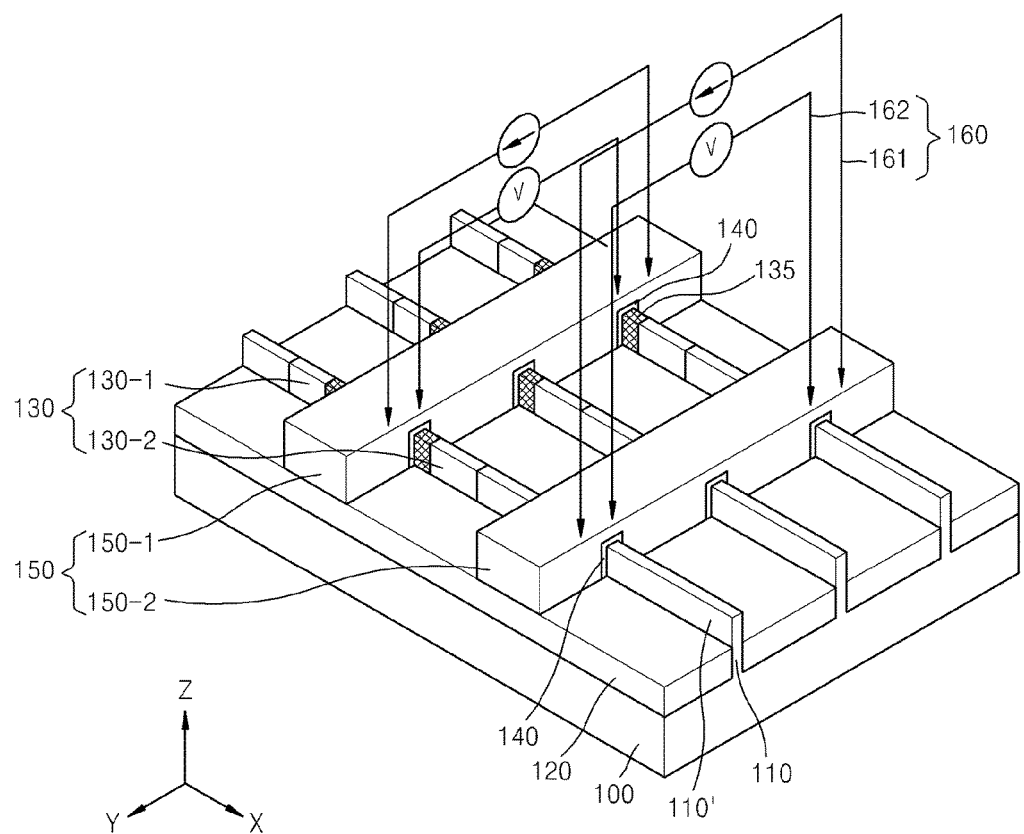

FIG. 4 illustrates a semiconductor device according to another example embodiment of inventive concepts.

Referring to FIG. 4, the semiconductor device connected to a plurality of gate lines 150 is provided. Thus, when there are a plurality of semiconductor devices, temperature distribution of each of the plurality of semiconductor devices may be known, and a danger of temperature measurement errors caused by malfunction may be reduced. In more detail, FIG. 4 illustrates the semiconductor device including dummy gate lines 150-2 to which a 4-point probe 160 is connected, and the gate lines 150-1 to which the 4-point probe 160 is connected.

Figure 5:
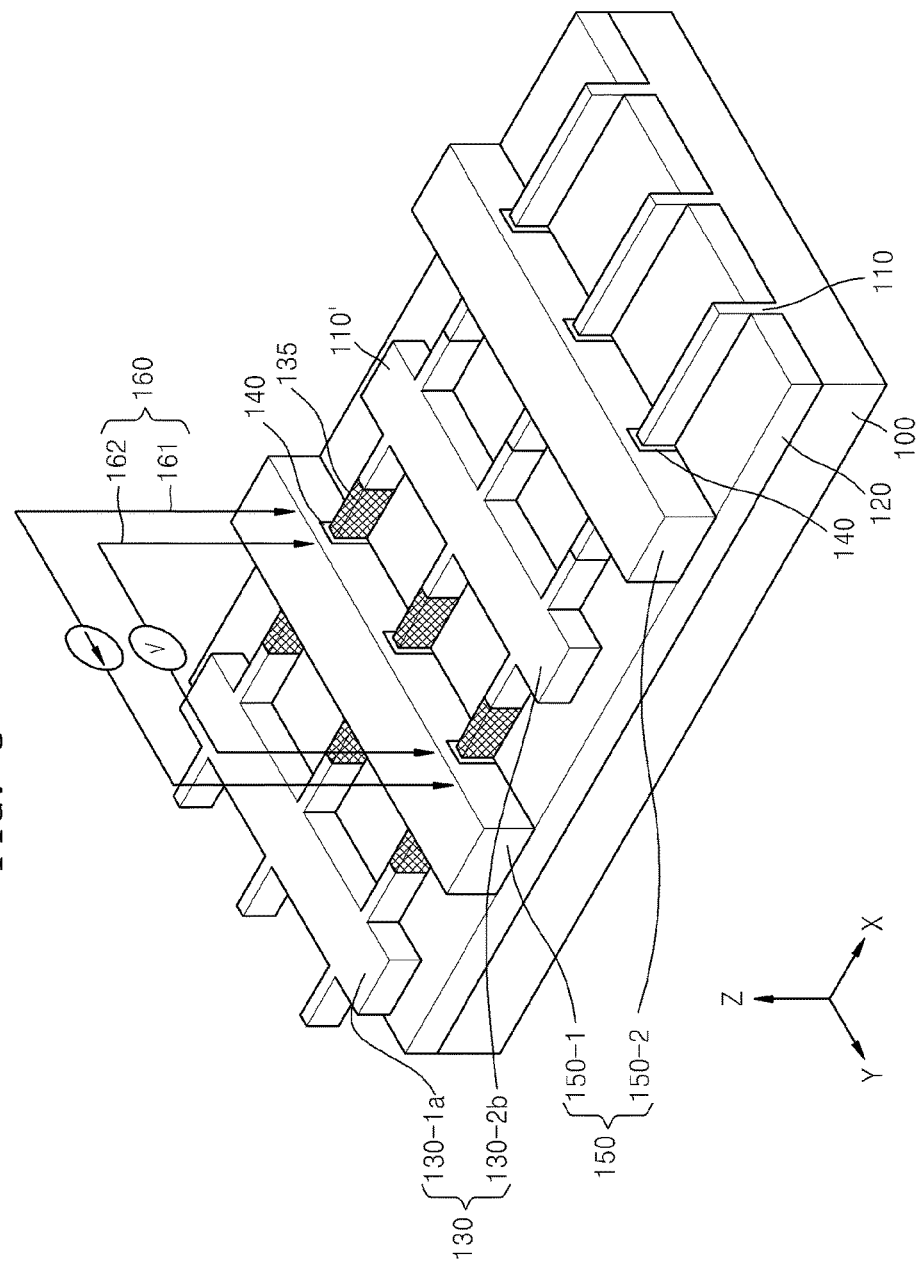

FIG. 5 illustrates a semiconductor device according to another example embodiment of inventive concepts.

Referring to FIG. 5, in comparison with the configuration of the semiconductor device described in FIG. 3, a plurality of semiconductor pins 110 constitute a source region 130-1a/a drain region 130-2b. This is a difference in the shape of the semiconductor substrate, but otherwise the semiconductor device illustrated in FIG. 5 is the same as the semiconductor device. In the example embodiment shown in FIG. 5, a 4-point probe 160 is connected to conductive lines 150, as described above. In more detail, the 4-point probe 160 is connected to gate lines 150-1 in the same or substantially the same manner as discussed above with regard to FIG. 3.

Figure 6:
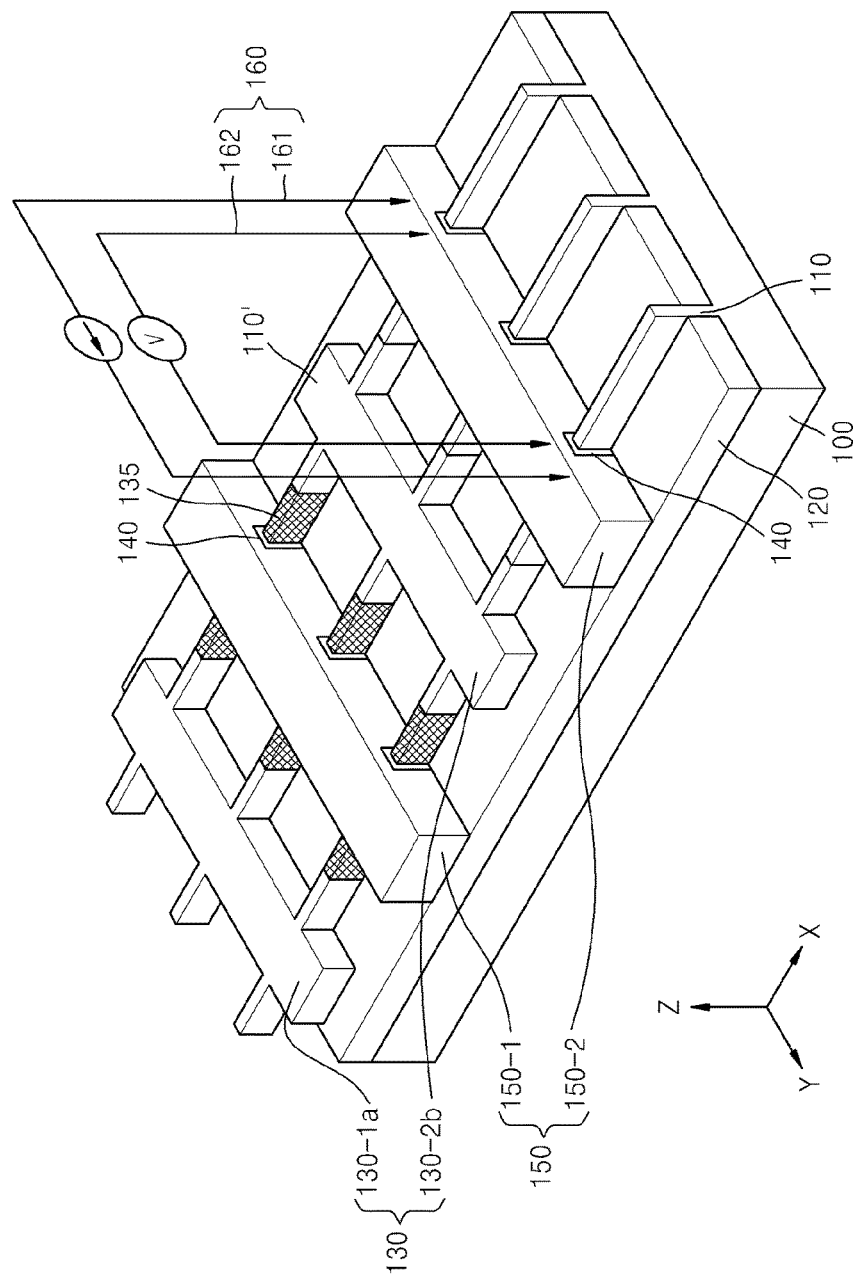

FIG. 6 illustrates a semiconductor device according to another example embodiment of inventive concepts.

Referring to FIG. 6, in comparison with the configuration of the semiconductor device described in FIG. 1, a plurality of semiconductor pins 110 constitute a source region 130-1a/a drain region 130-2b. This is a difference in the shape of the semiconductor substrate, but otherwise the semiconductor device illustrated in FIG. 6 is the same as the semiconductor device in FIG. 1 in which a 4-point probe 160 is connected to conductive lines 150, as described above. In more detail, in the example embodiment shown in FIG. 6, the 4-point probe 160 is connected to dummy gate lines 150-2.

Figure 7:
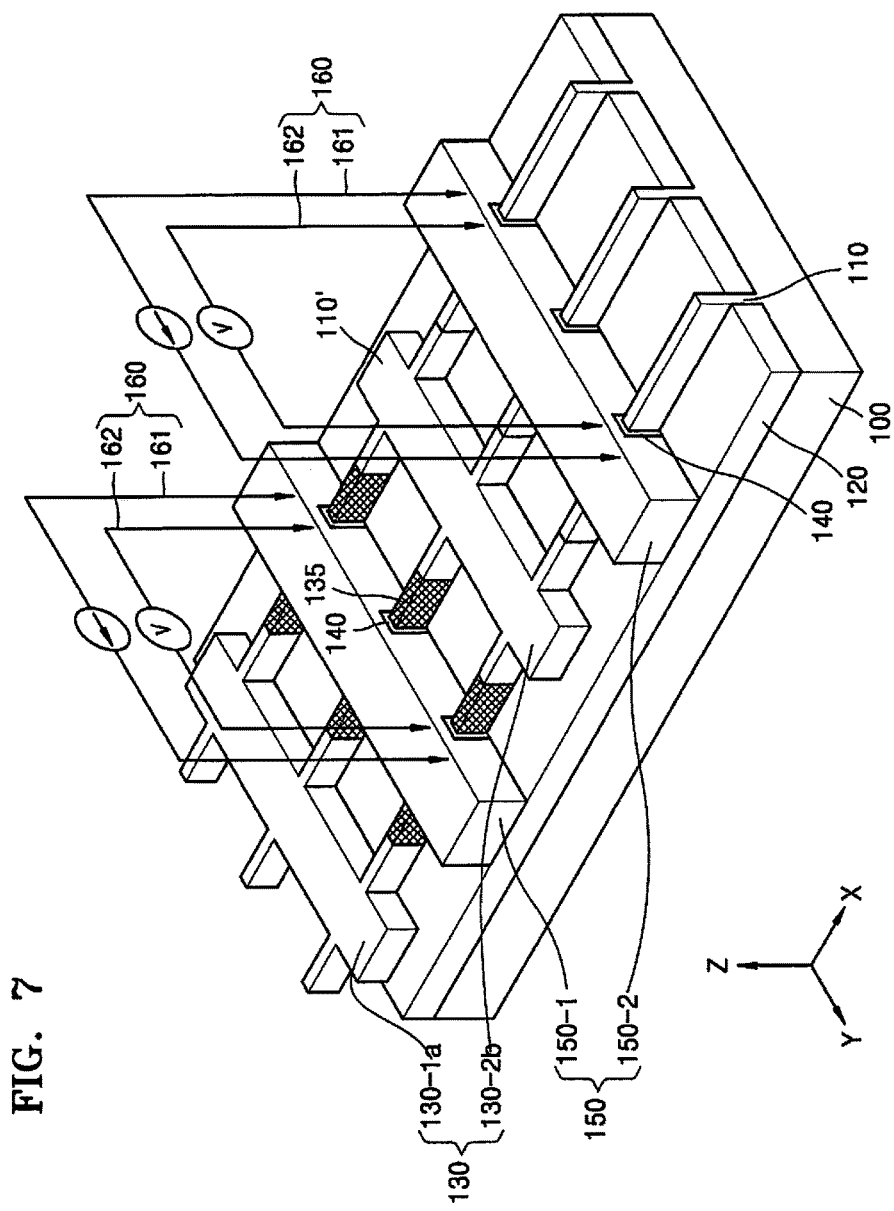

FIG. 7 illustrates a semiconductor device according to another example embodiment of inventive concepts.

Referring to FIG. 7, in comparison with the configuration of the semiconductor device described with regard to FIG. 4, a plurality of semiconductor pins 110 constitute a source region 130-1a/a drain region 130-2b. This is a difference in the shape of the semiconductor substrate, but otherwise the semiconductor device illustrated in FIG. 7 is the same as the semiconductor device shown in FIG. 4 in which a 4-point probe 160 is connected to conductive lines 150, as described above. In this example embodiment, the 4-point probe 160 is connected to two or more of a plurality of conductive lines 150, and two or more semiconductor devices according to inventive concepts are inserted into a circuit configuration. As described above, when there are a plurality of devices, temperature distribution in each of the plurality of devices may be known.

Figure 8:
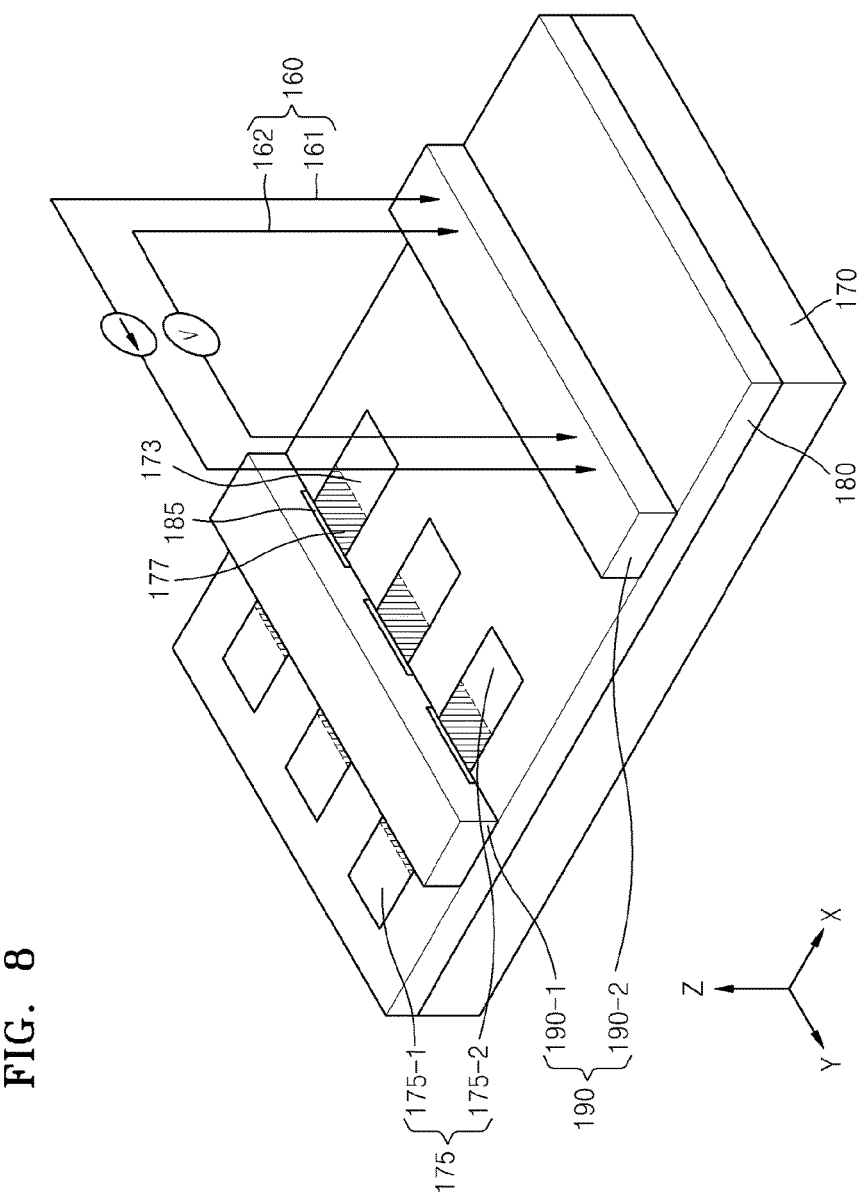

FIG. 8 illustrates a semiconductor device according to another example embodiment of inventive concepts.

Referring to FIG. 8, the semiconductor device in which a 4-point probe 160 is connected to conductive lines 190 formed in a two-dimensional semiconductor substrate 170 in which no semiconductor pin is formed, is provided. The semiconductor substrate 170 may be formed as a silicon substrate, as described above. A first insulating layer 180, such as an oxide layer, as well as a conductive region 175 and a channel region 177 is formed on an upper portion of the semiconductor substrate 170.

The conductive lines 190 are formed in a place in which portions of the conductive lines 190 are spaced apart from the conductive region 175 doped with the impurity due to a second insulating layer 185. The conductive lines 190 may include gate lines 190-1 and/or dummy gate lines 190-2. That is, for example, the gate lines 190-1 are formed in such a way that a first insulating layer 180 and an upper portion of the second insulating layer 185 extend in one direction (y-direction). This procedure is performed through a general etching process/deposition process/oxidation process.

When a voltage is applied to the gate lines 190-1, portions of the conductive region 175 that are spaced apart from each other due to the second insulating layer 185, constitute the channel region 177. When the circuit is driven, the conductive region 175 is an active region 173. The conductive lines 190 may include a plurality of gate lines 190-1 at intervals. The plurality of gate lines 190-1 may extend in parallel to each other on the semiconductor substrate 170 along one direction (y-direction)

The conductive lines 190 may include at least one of gate lines 190-1 that are essential for a circuit operation, and at least one of dummy gate lines 190-2 that have substantially no relation with the circuit operation.

In the example embodiment shown in FIG. 8, a 4-point probe 160 is connected to the dummy gate lines 190-2 that are formed in the channel region 177 of which temperature is to be measured, or the vicinity of the channel region 177. Two needles 161 of the 4-point probe 160 through which current flows, are connected to an outer side of the dummy gate lines 190-2. Two needles 162 that measure voltage are connected to an inner side of the dummy gate lines 190-2 relative to a position in which two needles 161 through which current flows are connected, thereby measuring resistance. In other words, the two needles 162 are connected to the dummy gate lines 190-2 inside the two needles 161.

In another example embodiment, the 4-point probe 160 may be connected to the dummy gate lines 190-2 that are closest to a position in which measurement is to be performed. This is to measure temperature at a position in which the dummy gate lines 190-2 is most adjacent to the channel region 177 and a difference of temperature may be reduced and/or minimized.

Figure 9:
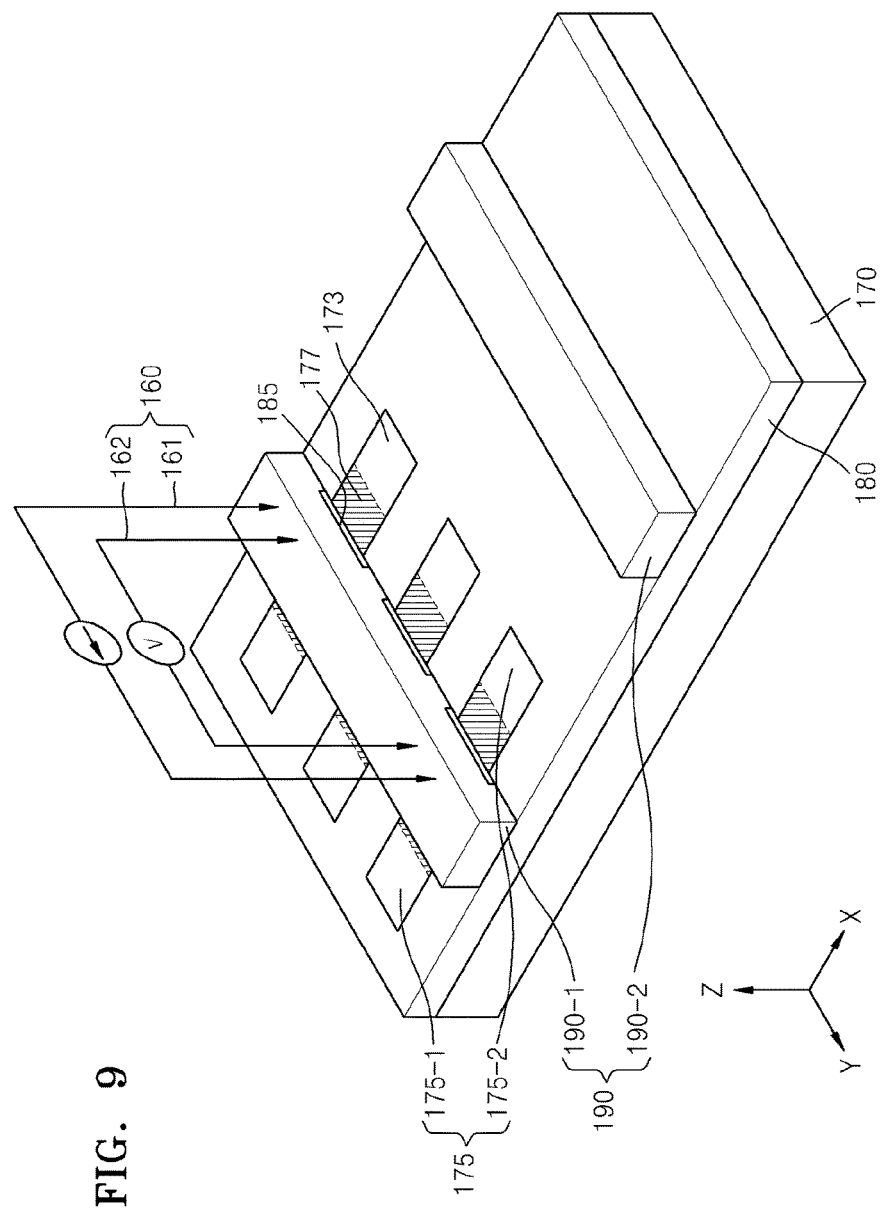

FIG. 9 illustrates a semiconductor device according to another example embodiment of inventive concepts.

Referring to FIG. 9, the configuration of FIG. 9 is similar to the configuration of FIG. 8, but a 4-point probe 160 is connected not to dummy gate lines 190-2, but to gate lines 190-1. The gate lines 190-1 are conductive lines closest to the channel region 177 and close to a position in which measurement is to be performed. Thus, temperature of the gate lines 190-1 may be measured during a time interval at which the device is not driven. Thus, at least some example embodiments of inventive concepts may provide the semiconductor device in which the 4-point probe 160 is connected to the gate lines 190-1.

In other example embodiments, a 4-point probe may be connected to two or more of the conductive lines 190 (e.g., gate lines 190-1 and dummy gate lines 190-2), and two or more semiconductor devices may be inserted into a circuit configuration. Temperature distribution in each of the semiconductor devices may be known, and a danger of temperature measurement errors caused by malfunction may be reduced.

Figure 10:
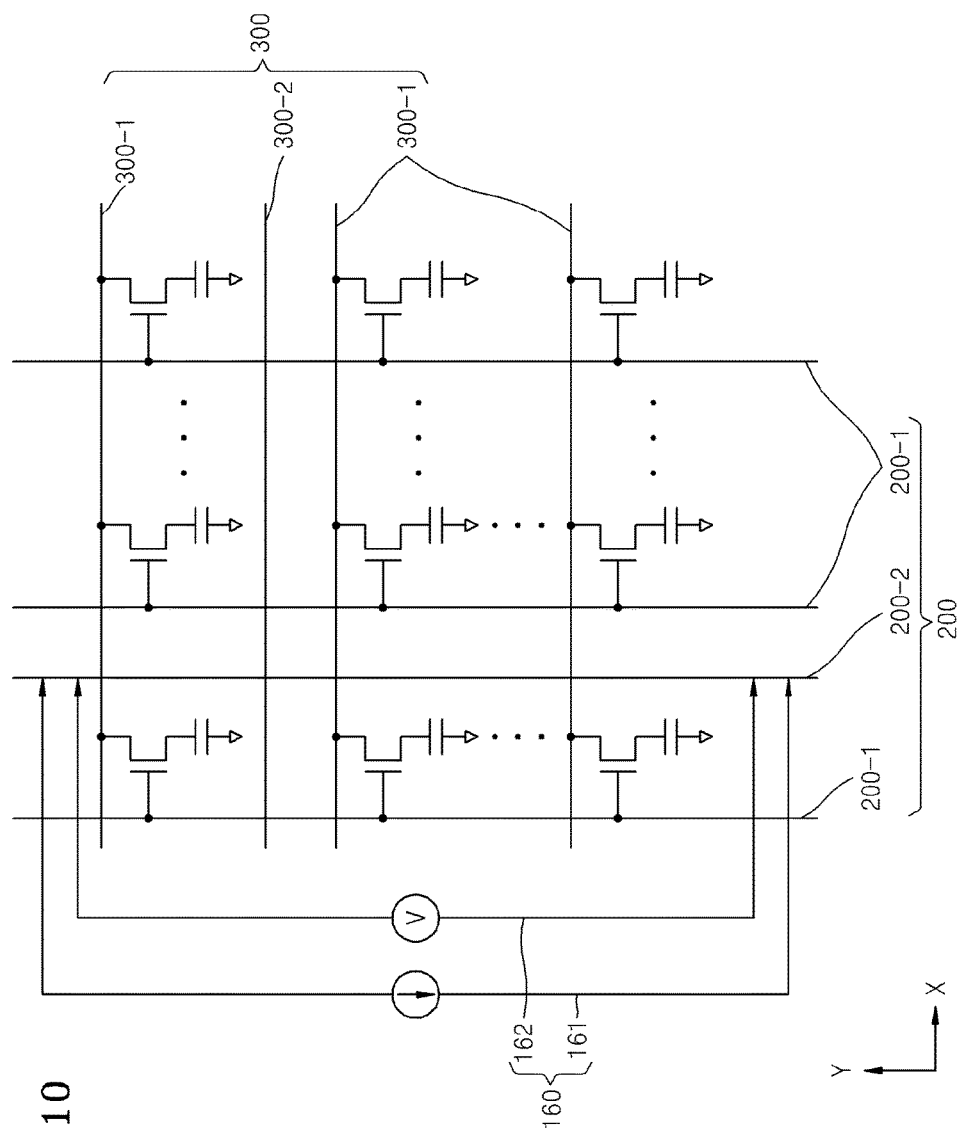
FIG. 10 is a plan circuit view of a semiconductor device according to an example embodiment of inventive concepts.

FIG. 10 illustrates a semiconductor device according to another example embodiment of inventive concepts.

Referring to FIG. 10, a plurality of conductive lines may be a plurality of wordlines 200 or a plurality of bitlines 300. A structure that extends in the y-direction is the plurality of wordlines 200, and a structure that extends in the x-direction is the plurality of bitlines 300.

The semiconductor device includes the plurality of wordlines 200 in which at least one of wordlines 200-1 that are essential for a circuit operation and at least one of dummy wordlines 200-2 that have substantially no relation with the circuit operation are included. In this example, a 4-point probe 160 is connected to the dummy wordlines 200-2.

In another example embodiment, a semiconductor device in which an electrode for temperature measurement is connected not to dummy wordlines, but to wordlines, may be provided. In this case, measurement may be performed only when the device is not driven, and owing to a distance advantage, temperature may be measured from the wordlines during a time interval at which the device is not driven.

Figure 11:
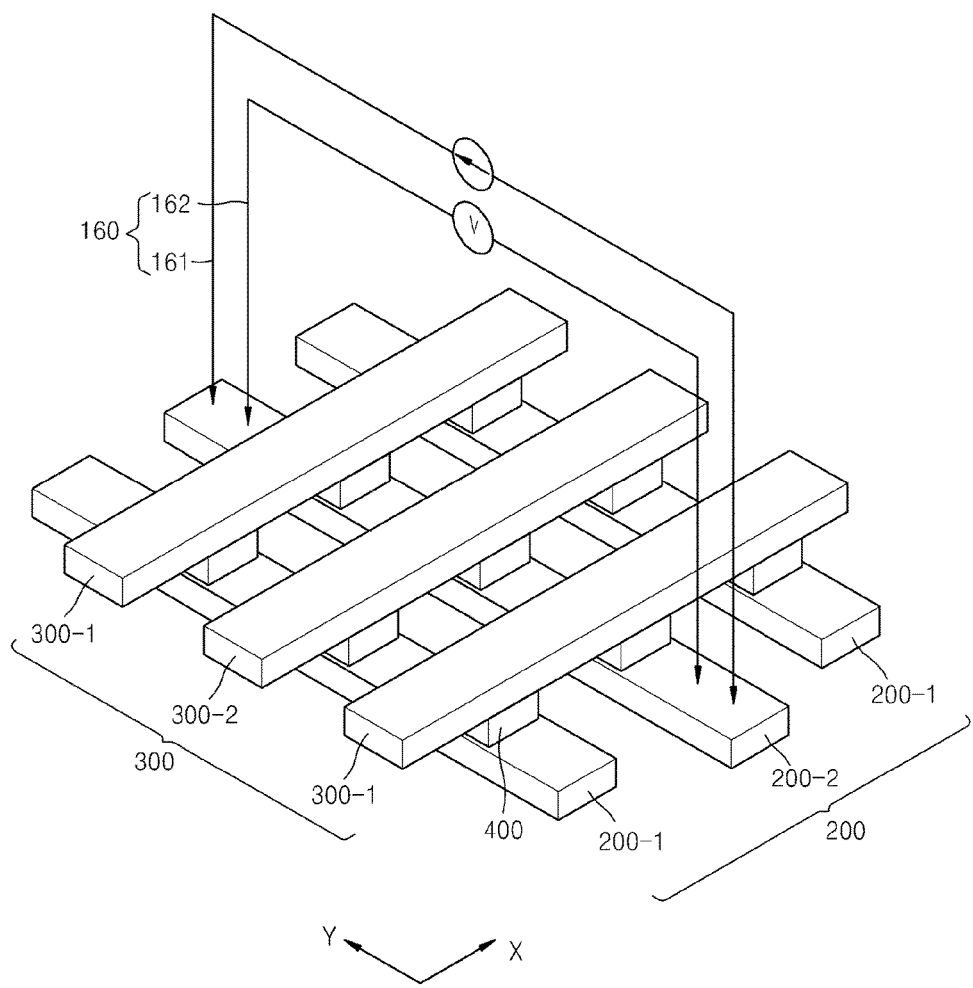
FIG. 11 is a perspective view illustrating a semiconductor device according to another example embodiment of inventive concepts.

FIG. 11 illustrates an example structure of the semiconductor device illustrated in FIG. 10. This uses an example embodiment of inventive concepts in a memory semiconductor.

Referring to FIG. 11, detailed features of the memory semiconductor are omitted, and the memory semiconductor is illustrated with elements required to explain inventive concepts. Thus, a box-shaped structure 400 between wordlines (or dummy wordlines) and bitlines (or dummy bitlines) is an element or configuration between wordlines and bitlines in various types of memory devices.

Figure 12:
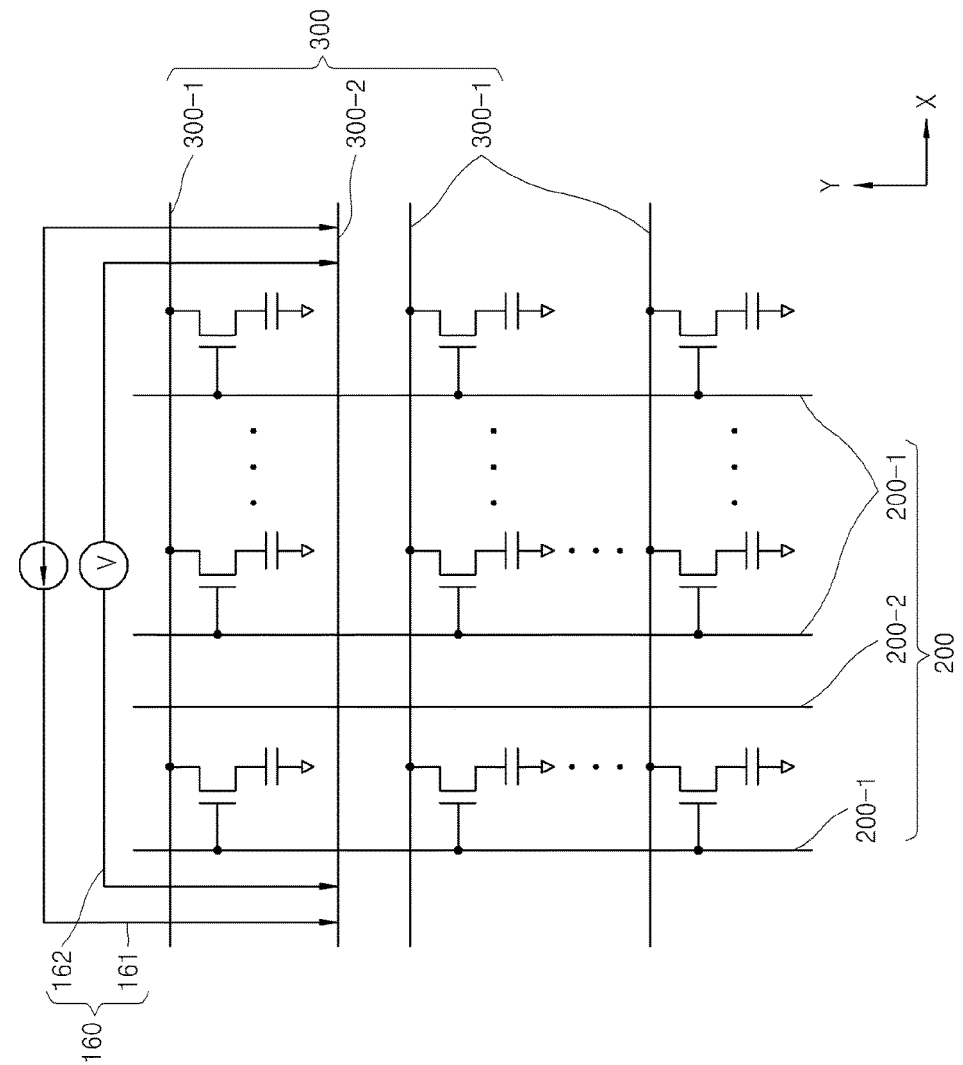
FIG. 12 is a plan circuit view of a semiconductor device according to an example embodiment.

FIG. 12 illustrates a semiconductor device according to another example embodiment of inventive concepts.

Referring to FIG. 12, a plurality of conductive lines may be a plurality of wordlines 200 or a plurality of bitlines 300. A structure that extends in the y-direction is the plurality of wordlines 200, and a structure that extends in the x-direction are the plurality of bitlines 300. The semiconductor device includes the plurality of bitlines 300 in which at least one of bitlines 300-1 that are essential for a circuit operation and at least one of dummy bitlines 300-2 that have substantially no relation with the circuit operation are included. In this example embodiment, a 4-point probe 160 is connected to the dummy bitlines 300-2.

In another example embodiment of inventive concepts, a semiconductor device in which an electrode for temperature measurement is connected to bitlines, such as bitlines 300-1 (not dummy bitlines), may be provided. In this case, measurement may be performed only when the device is not driven, and owing to a distance advantage, temperature may be measured from wordlines during a time interval at which the device is not driven.

Figure 13:
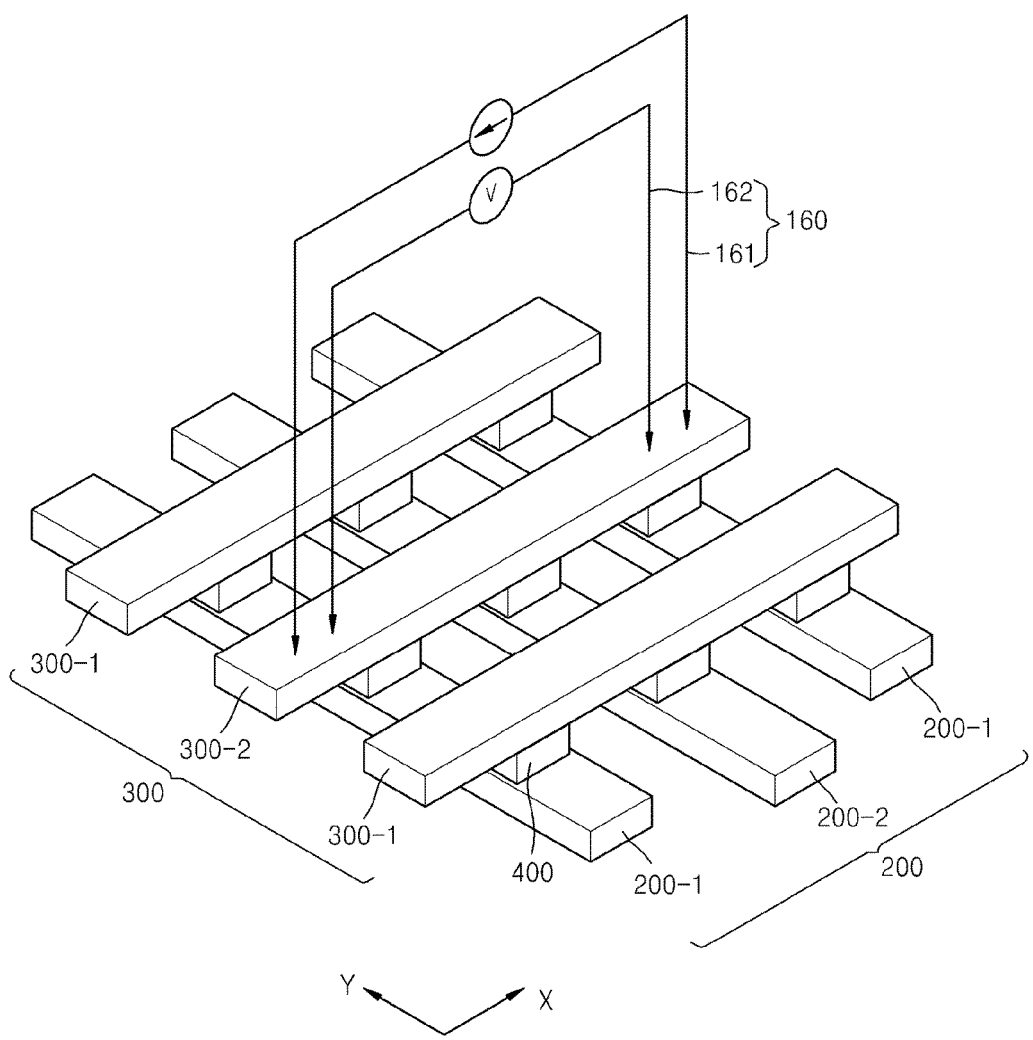
FIG. 13 is a perspective view illustrating a semiconductor device according to another example embodiment of inventive concepts.

FIG. 13 illustrates an example structure of the semiconductor device illustrated in FIG. 12. This uses an example embodiment of inventive concepts of a memory semiconductor.

Referring to FIG. 13, detailed features of the memory semiconductor are omitted, and the memory semiconductor is illustrated with elements required to achieve inventive concepts. Thus, a box-shaped structure 400 between wordlines (or dummy wordlines) and bitlines (or dummy bitlines) is an element or configuration that is between wordlines and bitlines in various types of memory devices.

In at least some example embodiments described above, an electrode for temperature measurement may be a 2-point probe. A case in which the 4-point probe described as the electrode for temperature measurement is replaced with the 2-point probe may be an example embodiment of inventive concepts. The 4-point probe may measure resistance in a comparatively precise manner, because two pins allow current to flow from both ends of an object to be measured and two pins measure voltage at an inner side. The 2-point probe includes two electrode pins, and resistance of the 2-point probe is included in two electrode pins and thus, an error may occur. Two pins are connected to both sides of conductive lines to be measured so that the 2-point probe may measure resistance.

A conductive configuration in the vicinity of an electric current-applied portion, as well as the gate lines/dummy gate lines, the wordlines/dummy wordlines, and/or the bitlines/dummy bitlines may be an object to be measured. In particular, the dummy configuration may measure temperature while the circuit is driven, and thus, may be advantageous. Also, a conductive configuration in the vicinity of the active region has a relatively small temperature dispersion, and thus, more exact and/or precise temperature may be measured by the conductive configuration.

Figure 14:
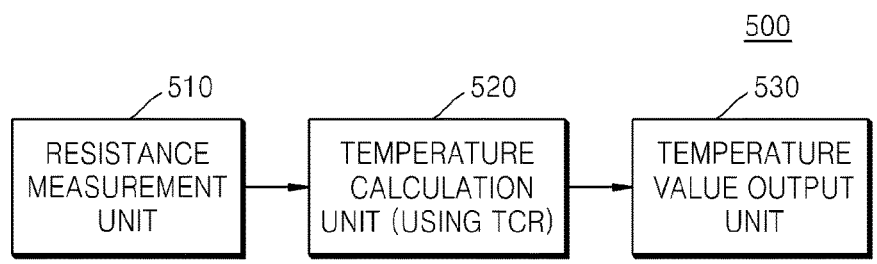
FIGS. 14 through 15 are schematic views of an electronic device including a semiconductor device, according to example embodiments of inventive concepts.

FIG. 14 is a block diagram of an electronic device 500 including a semiconductor device and a circuit configured to receive measured temperature and to output a signal corresponding to the temperature, according to an example embodiment of inventive concepts.

Referring to FIG. 14, the electronic device 500 includes: a resistance measurement unit/circuit 510; a temperature calculation unit/circuit 520; and a temperature value output unit/circuit 530. The resistance measurement unit 510 is configured as the semiconductor device described above, and measures a resistance variation rate of conductive lines. The temperature calculation unit 520 is configured as a circuit that calculates a temperature value by calculating the resistance variation rate with a temperature coefficient of the conductive lines. The temperature value output unit 530 is a display device.

Figure 15:
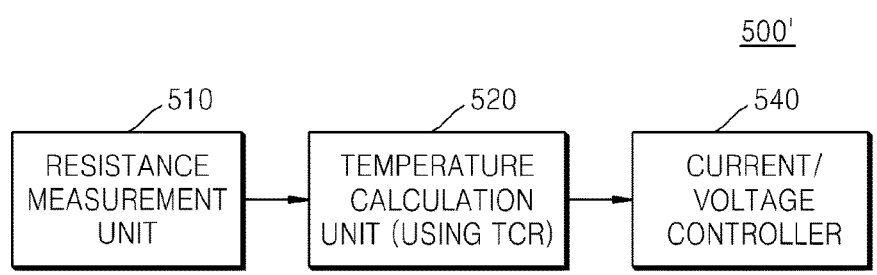

FIG. 15 is a block diagram of an electronic device 500' including a semiconductor device and a circuit configured to receive measured temperature and to output a signal corresponding to the temperature, according to an example embodiment of inventive concepts.

Referring to FIG. 15, the electronic device 500' includes: a resistance measurement unit/circuit 510; a temperature calculation unit/circuit 520; and a current/voltage controller 540. The resistance measurement unit 510 is configured as the semiconductor device described above and measures a resistance variation rate of conductive lines. The temperature calculation unit 520 is configured as a circuit that calculates a temperature value by calculating the resistance variation rate with a temperature coefficient of the conductive lines. The current/voltage controller 540 is configured as an operating circuit that controls a current/voltage by comparing the temperature value with a reference temperature set by the user. In an associated example embodiment, the temperature calculation unit 520 may be omitted, and the electronic device 500' may include the resistance measurement unit 510 and the current/voltage controller 540. In this case, the current/voltage controller 540 is configured as an operating circuit that controls an applied electric current/voltage by comparing a resistance current value with a reference current value set by the user.

Example embodiments of inventive concepts may function as a resistive temperature sensor that may measure a relatively precise (e.g., exact temperature and may be applied to other micro electro mechanical system (MEMSs)).

With regard to FIGS. 14 and 15, one or more of the resistance measurement unit 510, the temperature calculation unit 520, the temperature value output unit 530 and/or the current/voltage controller 540 may be at least partially implemented as hardware, firmware, hardware executing software or any combination thereof. When implemented as hardware, such hardware may include, inter alia, one or more Central Processing Units (CPUs), digital signal processors (DSPs), application-specific-integrated-circuits (ASICs), field programmable gate arrays (FPGAs) computers or the like configured as special purpose machines to perform the functions of the resistance measurement unit 510, the temperature calculation unit 520, the temperature value output unit 530 and/or the current/voltage controller 540. CPUs, DSPs, ASICs and FPGAs may generally be referred to as processors and/or microprocessors.

Figure 16:
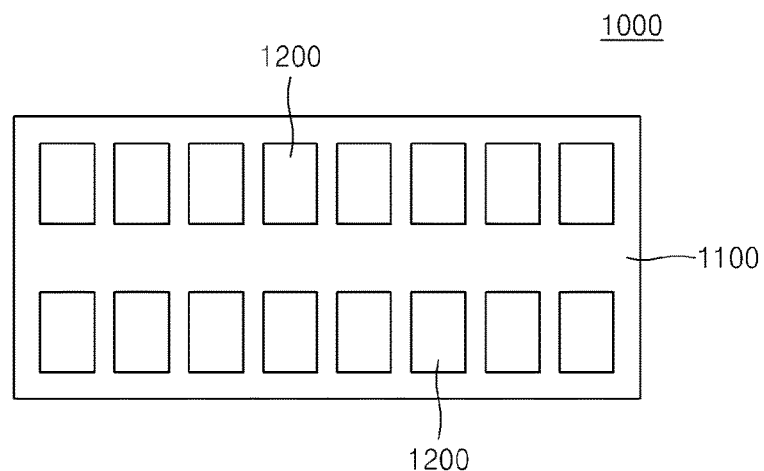
FIG. 16 is a block diagram of a memory block including a semiconductor device, according to an example embodiment of inventive concepts.

FIG. 16 is a plan view of a memory module 1000 including a semiconductor device, according to an example embodiment of inventive concepts.

Referring to FIG. 16, the memory module 1000 includes a semiconductor device that may more precisely measure temperature, thereby predicting the performance and reliability of a circuit. In more detail, the memory module 1000 may include a printed circuit board (PCB) 1100 and a plurality of semiconductor packages 1200.

The plurality of semiconductor packages 1200 may be configured as or may include a semiconductor device according to example embodiments of inventive concepts. In particular, the plurality of semiconductor packages 1200 may be packages including at least one of semiconductor devices selected from semiconductor devices according to one or more of the above-described example embodiments of inventive concepts.

The memory module 1000 according to one or more example embodiments of inventive concepts may be a single in-line memory module (SIMM) in which the plurality of semiconductor packages 1200 are mounted on only one surface of the PCB 1100, or a dual in-line memory module (DIMM) on which the plurality of semiconductor packages 1200 are arranged on both surfaces of the PCB 1100. Also, the memory module 1000 according to example embodiments of inventive concepts may be a fully buffered DIMM (FBDIMM) having an advanced memory buffer (AMB) that provides signals from the outside to each of the plurality of semiconductor packages 1200.

Figure 17:
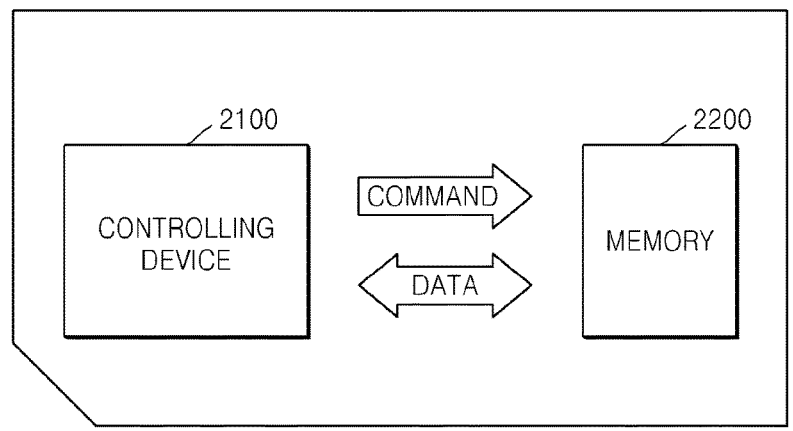
FIG. 17 is a block diagram of a memory card including a semiconductor device, according to an example embodiment of inventive concepts.

FIG. 17 is a schematic view of a memory card 2000 including a semiconductor device, according to an example embodiment of inventive concepts.

The memory card 2000 may be disposed in such a way that a controlling device 2100 and a memory 2200 may exchange electrical signals with each other. For example, if the controlling device 2100 gives a command, the memory 2200 may transmit data.

The memory 2200 may include a semiconductor device according to example embodiments of inventive concepts. In particular, the memory 2200 may include at least one of the semiconductor devices according to the above-described example embodiments of inventive concepts.

The memory card 2000 may be one of various memory cards, such as a memory stick card, a smart media card (SM), a secure digital card (SD), a mini-secure digital (mini SD) card, and a multimedia card (MMC).

Figure 18:
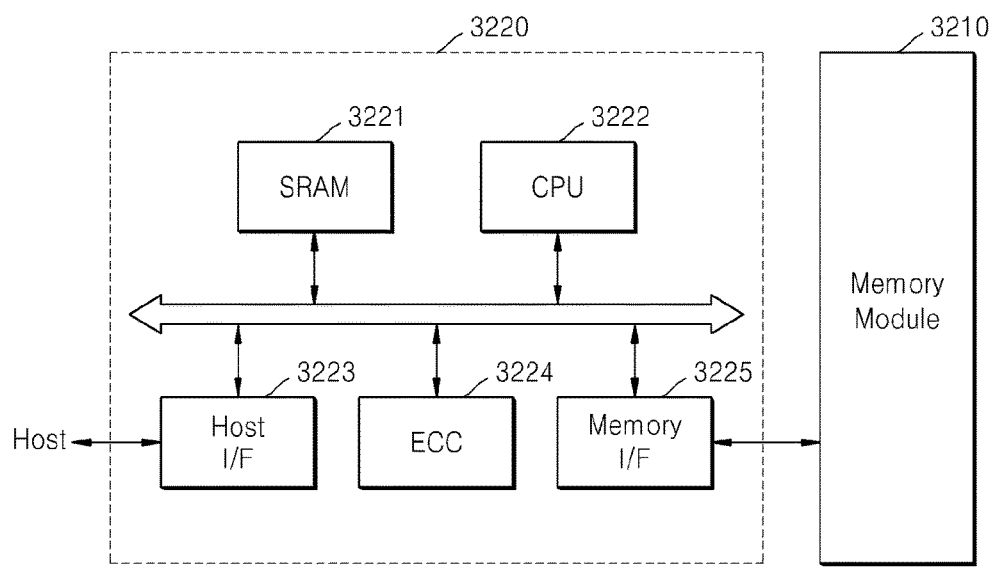
FIG. 18 is a block diagram of a memory device including a semiconductor device, according to an example embodiment of inventive concepts.

FIG. 18 is a block diagram illustrating an example of a memory device 3200 including a semiconductor device, according to an example embodiment of inventive concepts.

Referring to FIG. 18, the memory device 3200 according to at least this example embodiment of inventive concepts includes a memory module 3210. The memory module 3210 may include at least one of the semiconductor devices according to the above-described example embodiments. Also, the memory module 3210 may further include other types of semiconductor memory devices, for example, nonvolatile memory device and/or a static random access memory (SRAM) device. The memory device 3200 may include a memory controller 3220 that controls data exchange between a host and the memory module 3210.

The memory controller 3220 may include a processing unit 3222 that controls an overall operation of a memory card. Also, the memory controller 3220 may include an SRAM 3221 that is used as an operating memory of the processing unit 3222. In addition, the memory controller 3220 may further include a host interface 3223 and a memory interface 3225. The host interface 3223 may include a data exchange protocol between the memory device 3200 and the host. The memory interface 3225 may cause the memory controller 3220 and the memory module 3210 to be connected to each other. Furthermore, the memory controller 3220 may further include an error correction block (ECC) 3224. The ECC 3224 may detect and correct an error of data read from the memory module 3210. Although not shown, the memory device 3200 may further include a read only memory (ROM) device that stores code data for interfacing with the host. The memory device 3200 may be implemented as a solid state drive (SSD) that may replace a hard disc of a computer system.

Figure 19:
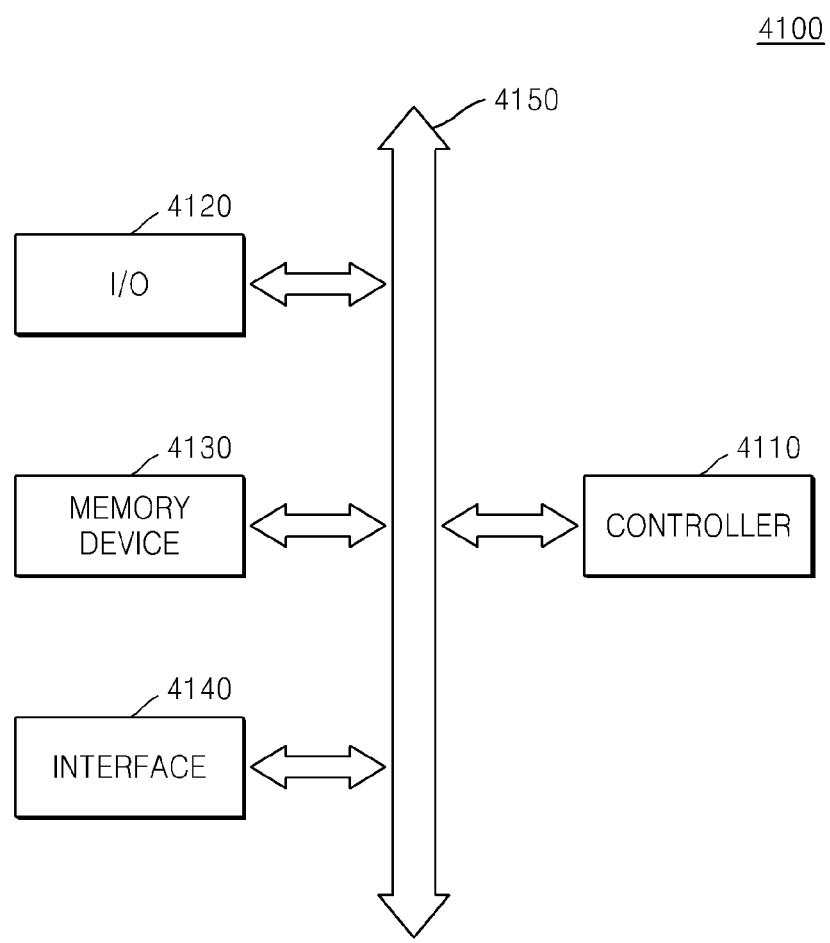
FIG. 19 is a block diagram of an electronic system including a semiconductor device, according to an example embodiment of inventive concepts.

FIG. 19 is a block diagram illustrating an example of an electronic system 4100 including a semiconductor device, according to an example embodiment of the inventive concept.

Referring to FIG. 19, the electronic system 4100 according to at least this example embodiment of inventive concepts may include: a controller 4110; an input/output device (I/O) 4120; a memory device 4130; an interface 4140; and a bus 4150. The controller 4110, the I/O 4120, the memory device 4130 and/or the interface 4140 may be coupled to each other via the bus 4150. The bus 4150 corresponds to a path on which data move.

The controller 4110 may include at least one selected from a microprocessor, a digital signal processor, a microcontroller, and logic devices that may perform similar functions as those of the microprocessor, the digital signal processor and the microcontroller. The I/O 4120 may include a keypad, a keyboard, and a display device. The memory device 4130 may store data and/or command. The memory device 4130 may include at least one selected from semiconductor devices according to the above-described example embodiments. Also, the memory device 4130 may further include other types of semiconductor memory devices, for example, a nonvolatile memory device and/or an SRAM device. The interface 4140 may perform a function of transmitting data to a communication network or receiving data from the communication network. The interface 4140 may have wired and/or wireless capabilities. For example, the interface 4140 may include an antenna or a wired/wireless transceiver. Although not shown, the electronic system 4100 that is an operating memory device for improving an operation of the controller 4110 may further include a high-speed dynamic RAM (DRAM) device and/or SRAM device.

The electronic system 4100 may be applied to a personal digital assistant (PDA), a portable computer, a web tablet, a wireless phone, a mobile phone, a digital music player, a memory card, or any electronic products that may transmit and/or receive information in a wireless environment.

Figure 20:
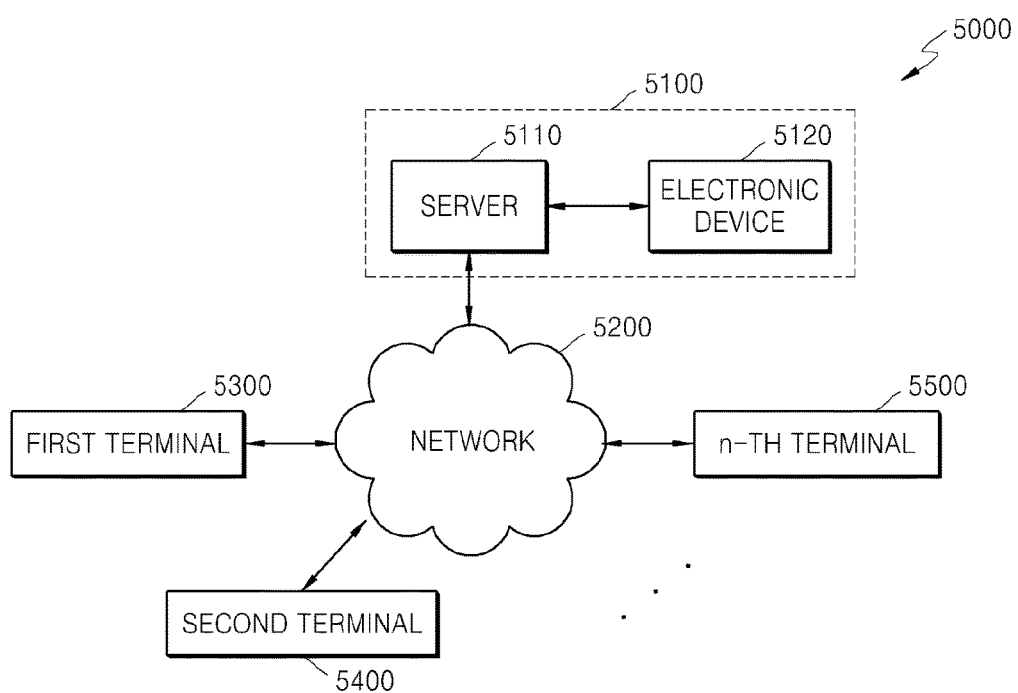
FIG. 20 is a block diagram of a network system including a semiconductor device, according to an example embodiment of inventive concepts.

FIG. 20 is a block diagram illustrating an example in which a network for a server system including an electronic device is implemented, according to an example embodiment of inventive concepts.

Referring to FIG. 20, a network system 5000 according to at least this example embodiment of inventive concepts may include a server system 5100 and a plurality of terminals 5300, 5400, 5500 that are connected to each other via a network 5200. The server system 5100 according to at least this example embodiment of inventive concepts may include a server 5110 that processes a request received from the plurality of terminals 5300, 5400, and 5500 connected to the server system 5100 via the network 5200, and an electronic device 5120 that stores data corresponding to the request received from the terminals 5300, 5400, and 5500. In this case, one or more of the semiconductor devices illustrated in FIGS. 1 through 12 may be used as or included in the electronic device 5120. The electronic device 5120 may be a SSD, for example.

The electronic device 5120 may be mounted using various types of packages. For example, the electronic device 5120 may be mounted using packages, such as package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metricquad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

While inventive concepts have been particularly shown and described with reference to example embodiments thereof, it will be understood that various changes in form and details may be made therein without departing from the spirit and scope of the following claims.

What is claimed is:

1. A semiconductor device comprising:
   a semiconductor substrate;

a plurality of conductive lines formed on the semiconductor substrate;
an electrode for temperature measurement, the electrode being connected to the plurality of conductive lines; and
an active region in the semiconductor substrate, wherein
the plurality of conductive lines connected to the electrode for temperature measurement are gate lines,
the active region extends in a first direction,
the active region includes a source region, a drain region, and a channel region,
the channel region is between the source region and the drain region,
the gate lines pass a top surface of the channel region, and
the gate lines extend in a second direction, the second direction being different from the first direction.

2. The semiconductor device of claim 1, wherein the gate lines include at least one dummy gate line.

3. The semiconductor device of claim 1, wherein the gate lines include at least one wordline and at least one dummy wordline.

4. The semiconductor device of claim 1, wherein:
the active region is fin-shaped; and
the gate lines pass the top surface and sidewalls of the channel region.

5. The semiconductor device of claim 4, wherein the active region includes a plurality of fm-shaped structures that are shared at sides of the active region.

6. The semiconductor device of claim 1, wherein the gate lines are dummy gate lines.

7. The semiconductor device of claim 6, wherein the dummy gate lines are dummy gate lines positioned closest to an element for which temperature is to be measured.

8. The semiconductor device of claim 1, wherein the electrode connected to the plurality of conductive lines is a 4-point probe.

9. The semiconductor device of claim 8, wherein the semiconductor device is configured to output temperature according to resistance measured by the 4-point probe using a temperature coefficient of resistance (TCR).

10. An electronic device comprising:
the semiconductor device of claim 1; and
a circuit configured to receive a temperature measured using the electrode, and to output a signal corresponding to the temperature.

11. The electronic device of claim 10, wherein the circuit that operates according to the temperature is at least one of a current and voltage controller.

12. A semiconductor device, comprising:
a semiconductor substrate;
a plurality of conductive lines formed on the semiconductor substrate; and
an electrode for temperature measurement, the electrode being connected to the plurality of conductive lines, wherein
the plurality of conductive lines include at least one bitline and at least one dummy bitline.

13. An electronic device comprising:
at least one multipoint probe connected to at least one of a plurality of conductive lines of a semiconductor device, the at least one multipoint probe being configured to measure resistance of the at least one of the plurality of conductive lines, the resistance being indicative of temperature changes in the semiconductor device; and
a temperature calculation circuit configured to calculate a temperature based on the resistance measured by the at least one multipoint probe according to a temperature coefficient of resistance (TCR).

14. The electronic device of claim 13, wherein the multipoint probe is one of a 4-point and a 2-point probe configured to measure a resistance variation rate of the at least one of the plurality of conductive lines.

15. The electronic device of claim 13, wherein the at least one of the plurality of conductive lines includes at least one of a gate line, a wordline, a bitline, a dummy gate line, a dummy wordline and a dummy bitline.

16. The electronic device of claim 13, wherein the multipoint probe is connected directly to the at least one of the plurality of conductive lines.

17. The electronic device of claim 13, further comprising:
a temperature output circuit configured to output at least one of the temperature, a voltage and a current according to the temperature.

* * * * *